United States Patent [19]

Norsworthy

[11] Patent Number: 5,144,308

[45] Date of Patent: Sep. 1, 1992

[54] IDLE CHANNEL TONE AND PERIODIC NOISE SUPPRESSION FOR SIGMA-DELTA MODULATORS USING HIGH-LEVEL DITHER

[75] Inventor: Steven R. Norsworthy, Emmaus, Pa.

[73] Assignee: AT&T Bell Laboratories, Murray Hill, N.J.

[21] Appl. No.: 703,527

[22] Filed: May 21, 1991

[51] Int. Cl.$^5$ ............................................. H03M 1/20
[52] U.S. Cl. ..................................... 341/131; 341/143
[58] Field of Search ................................ 341/131, 143

[56] References Cited

U.S. PATENT DOCUMENTS

| | | | |
|---|---|---|---|
| 3,999,129 | 12/1976 | Kasson | 341/131 X |
| 4,761,634 | 8/1988 | Yamaguchi et al. | 341/131 |
| 5,010,347 | 4/1991 | Yukawa | 341/131 X |
| 5,055,843 | 10/1991 | Ferguson, Jr. et al. | 341/143 |
| 5,073,777 | 12/1991 | Fukuhara et al. | 341/131 |

FOREIGN PATENT DOCUMENTS

| | | | |
|---|---|---|---|
| 63-252015 | 10/1988 | Japan | 341/131 |
| 02-25116 | 1/1990 | Japan | 341/131 |

OTHER PUBLICATIONS

"A Voiceband Codec with Digital Filtering", *IEEE Transactions on Communications*, vol. COM-29, No. 6, Jun. 1981 James C. Candy, Bruce A. Wooley, Oconnel J. Benjamin pp. 815 through 830.

"Use of Double Integration is Sigma Delta Modulation", *IEEE Transactions on Communications*, vol. CO-M-33, No. 3, Mar. 1985 James C. Candy pp. 249 through 258.

"Maximum-Length Shift-Register Codes", *Digital Communications*, pp. 256 through 258, John G. Proakis, McGraw-Hill Book Company, Copyright 1983.

*Primary Examiner*—Howard L. Williams
*Attorney, Agent, or Firm*—S. W. McLellan

[57] ABSTRACT

Technique for adding a dither signal to a sigma-delta modulator to remove low level tones and periodic noise in the desired passband of the modulator when no, or a very low, signal is present (idle). The dither signal is a high-level signal added to the imput of an quantizer in the modulator, the normalized power in the AC component thereof being at least about $$\frac{2^{-2(N-1)}}{12}$$

of the square of the quantizer step, where N is the order of the modulator. No significant reduction in the dynamic range of the modulator results. The technique may also be applied to multiple order sigma-delta modulators as well as to multiple stage sigma-delta modulators. Further, the dither may be added at any point in the modulator with suitable filtering of the dither. The transfer function of the filter is proportional to the noise shaping transfer function of the modulator between the point of addition of the dither and the input to the quantizer.

17 Claims, 4 Drawing Sheets

IDLE CHANNEL TONE AND PERIODIC NOISE SUPPRESSION FOR SIGMA-DELTA MODULATORS USING HIGH-LEVEL DITHER

BACKGROUND OF THE INVENTION

1. Field of the Invention

This invention relates to oversampling techniques in general and, more particularly, to oversampling sigma-delta modulators.

2. Description of the Prior Art

Sigma-delta ($\Sigma$-$\Delta$) techniques (as part of the digital-to-analog or analog-to-digital conversion function) are finding wide acceptance in many applications, such as telephone codecs, compact disc (CD) players and the like. $\Sigma$-$\Delta$ techniques are popular because of the tolerance of the techniques to circuit variations present in integrated circuit fabrication processes. Hence, a sixteen or more bit linear converter may be implemented relatively inexpensively in integrated form, compared to more conventional circuit techniques such as flash converters or subranging converters.

$\Sigma$-$\Delta$ converters are not without drawbacks, however. High bit rate processing is required, pushing low power technologies (such as CMOS) to their limits, especially with wide bandwidth signals such as digital audio. In addition, $\Sigma$-$\Delta$ converters suffer from periodic noise and spurious tone generation (in-band and out-of-band) due to the feedback required to implement the converter, which will be discussed in more detail below. Although the periodic noise and spurious tones typically occur at very low levels (for example, at about 90 dB below full scale), they may be very objectionable to a human listener while having virtually no impact on a data acquisition system using the same converter. The noise and tones are typically noticeable to a human listener when no, or a very low, desired signal is present. The periodic noise and tones are generally referred to as idle channel noise.

Prior art techniques for removing the periodic noise and tones generally attempt to "whiten" the periodic noise and tones from the converter, thereby suppressing them. These techniques include adding a small dither signal (noise) or an out-of-band tone (such as a 25 KHz sine wave, which is above the human ear's hearing frequency range) to the input to the $\Sigma$-$\Delta$ converter. Generally, the addition of the dither signal is not regarded as wholly effective since it adds noise to the output of the converter (which may raise the noise floor of the converter) while not entirely suppressing the periodic noise and spurious tones. While the out-of-band tone insertion may reduce the in-band spurious tones, the dynamic range of the converter suffers since the converter now has to process the desired signal and out-of-band tone without saturating.

SUMMARY OF THE INVENTION

In accordance with one embodiment of the invention, a sigma-delta ($\Sigma$-$\Delta$) modulator, with substantially suppressed idle channel periodic noise and tones, has at least one integrator and a quantizer. The quantizer has a predetermined step size, the input thereof coupled to the output of the integrator. The modulator is characterized by means for adding a dither signal to the output of the integrator, the dither signal having a predetermined normalized power in the AC component thereof (related to the variance of the probability density function of the dither signal). The normalized AC power of the dither signal is at least approximately $$\frac{2^{-2(N-1)}}{12}$$

for $N \geq 2$; or $1/12$ for $N = 1$; of the square of the predetermined step size of the quantizer, where N is the number of integrators in the modulator.

In accordance with another embodiment of the invention, a $\Sigma$-$\Delta$ modulator has at least one integrator and a quantizer. The quantizer has a predetermined step size, the input thereof coupled to the output of the integrator. The modulator is characterized by means for adding a dither signal to a point within the modulator and by a filter means for filtering the dither signal prior to being added to the modulator by the means.

In accordance with still another embodiment of the invention, a multi-stage sigma-delta ($\Sigma$-$\Delta$) modulator has at least one integrator and a quantizer. The quantizer has a predetermined step size, the input thereof coupling to the output of the integrator. The modulator is characterized by means for adding a dither signal to a point within the modulator and by filter means for filtering the dither signal prior to being added to the modulator by the means. The transfer function of the filter means is proportional to the noise shaping transfer function of the modulator between the point of addition of the dither and the input to the quantizer.

The advantages derived from the invention include the substantial suppression of idle channel periodic noise and spurious tones without significantly increasing the noise floor of the modulator or substantially impacting the dynamic range thereof.

BRIEF DESCRIPTION OF THE DRAWING

The foregoing features of this invention, as well as the invention itself, may be more fully understood from the following detailed description of the drawings, in which.

DETAILED DESCRIPTION

For purposes here, a sigma-delta ($\Sigma$-$\Delta$) modulator is a modulator having at least one integrator between the input of the modulator and the quantizer therein. Such a modulator is also known either as delta-sigma ($\Delta$-$\Sigma$) modulator, or an interpolative noise-shaping modulator or coder. The number of integrators in the modulator is generally referred to as the order of the modulator.

Dither is added to the $\Sigma$-$\Delta$ modulators discussed herein to substantially suppress spurious tones and periodic noise in such modulators. For purposes here, the dither signal is a random noise signal having a predetermined probability density function, or PDF. Preferably, the average, or mean, of the PDF (or of the noise signal itself) is substantially zero, i.e., there is no significant DC energy in the noise signal. As is well known, the normalized power in the AC (the time-varying) component of the noise signal is substantially equal to the variance of the noise signal's PDF and is, therefore, dependent on the shape of the noise signal's PDF. As will be discussed below, the PDF of the noise signal may be rectangular, triangular, $n^{th}$ order, Gaussian, etc.

The amount of power the noise (dither) signal has substantially determines the effectiveness of the spurious tones and periodic noise suppression. Because the discussion of the invention involves normalized power, the amount of power is related to the square of the quantizer step size, as will be discussed below. An alternative approach is to recognize that the standard deviation of the noise (dither) signal (equal to the square root of the variance, or normalized power, of the noise signal) and the quantizer step size are directly related. For convenience, however, the normalized power of the noise signal and squared step size of the quantizer is used herein to describe the invention.

Of the $\Sigma$-$\Delta$ modulators presented here, the transfer function of a modulator is dependent on the number of integrators therein, among other factors. Quantizers, being non-linear devices, contribute noise to the modulator. The effect of the modulator on that noise is referred to here as the noise shaping transfer function of the modulator. As will be discussed in more detail below, the noise shaping transfer function is dependent upon where the noise is measured within the modulator.

Figure 2:
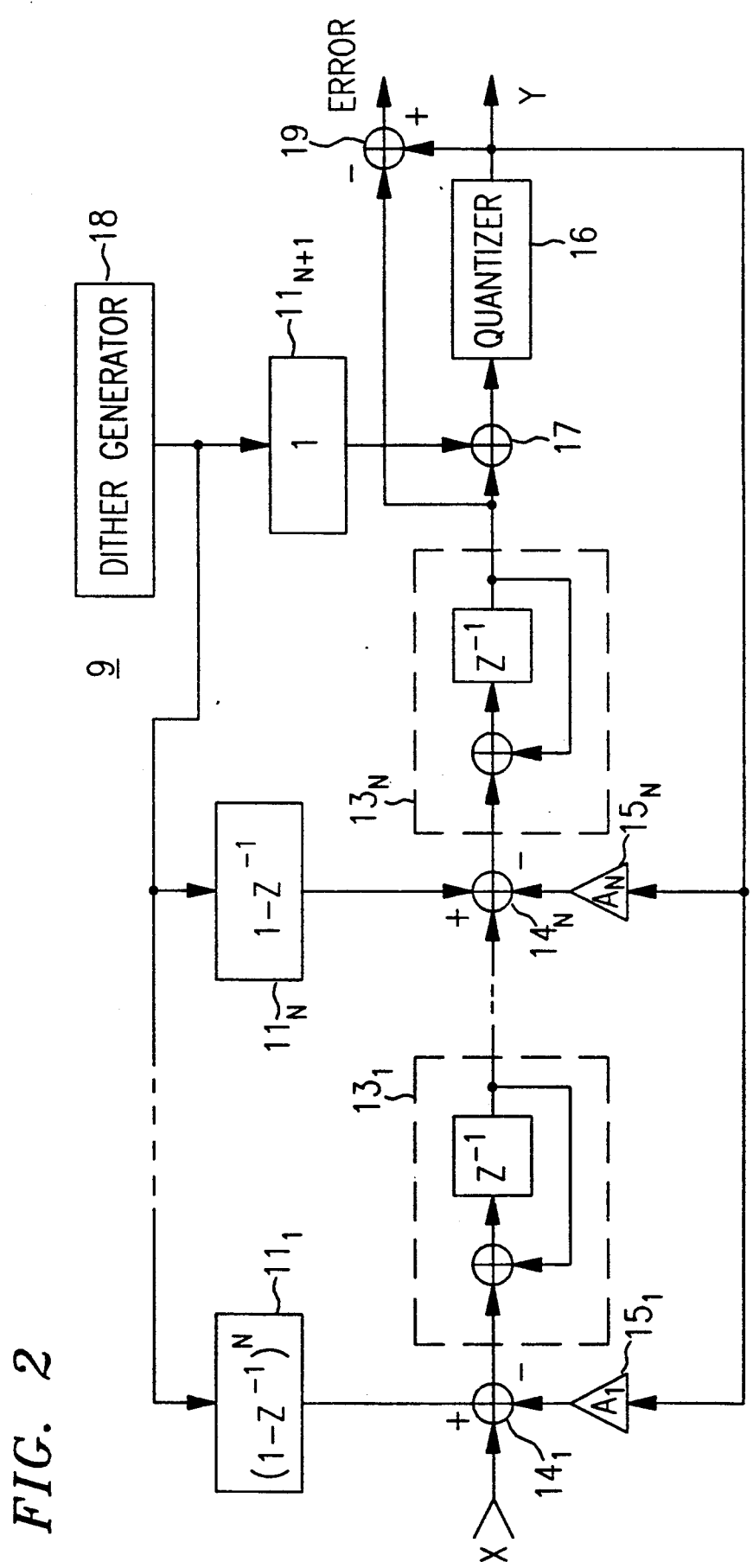
FIG. 2 is a simplified diagram of a sigma-delta modulator, according to one embodiment of the invention.

The invention may be understood generally from the $\Sigma$-$\Delta$ modulator 9 diagramed in FIG. 2. As will be discussed in more detail below and in accordance with one embodiment of the invention, the output of an integrator $13_N$ is coupled to the input of a quantizer 16 via a summer 17. The quantizer 16 has at least one predetermined quantization step size. Added to the signal from the output of the integrator $13_N$ is a noise signal from a dither generator 18. The noise signal (also referred to here as a dither signal) has an average value of about zero (substantially no DC energy). Preferably, the normalized power in the AC component of the noise signal is at least about $$\frac{2^{-2(N-1)}}{12}$$

times the square of the predetermined step size of the quantizer 16, where N is the number of integrators (order) of the $\Sigma$-$\Delta$ modulator 9 for two or more integrators. For one integrator in the $\Sigma$-$\Delta$ modulator 9 (N=1), the normalized power in the AC component of the noise signal is at least about 1/12 the square of the predetermined step size of the quantizer 16.

In addition to the embodiment of the modulator 9 shown in FIG. 2, the dither signal may be injected at any point within the modulator 9, the dither being filtered by filters $11_1$–$11_N$ before being added to the modulator 9. The transfer function of the filters $11_1$–$11_N$ is substantially equal to the noise shaping transfer function of the modulator between the point of adding the dither and the input to the quantizer, 16. The foregoing is also applicable to the modulator 9 embodiment shown in FIG. 3.

Figure 4:
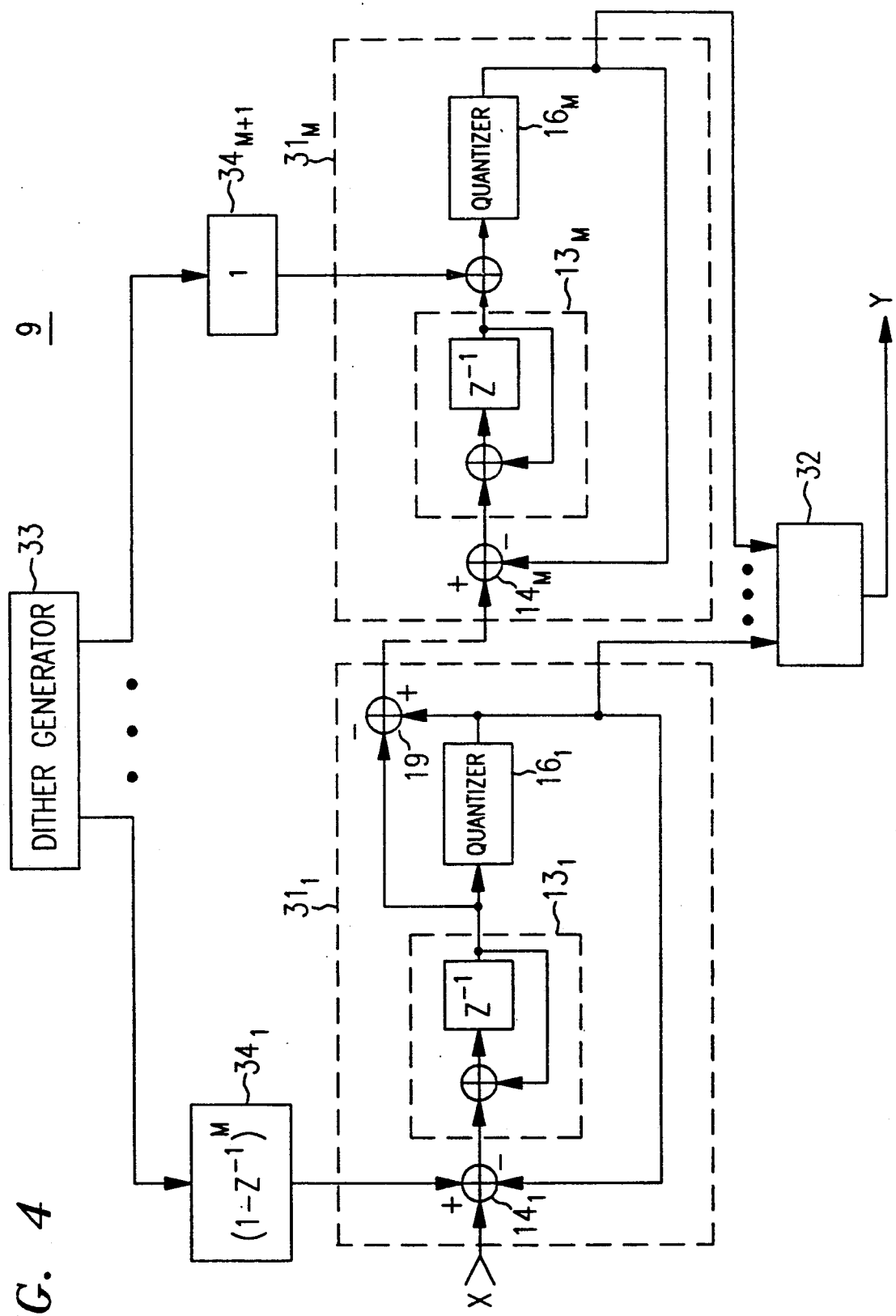

An alternative exemplary embodiment of a modulator is shown in FIG. 4, a multi-stage $\Sigma$-$\Delta$ modulator 9. As will be discussed in more detail below, the modulator 9 has a plurality of stages $31_1$–$31_M$ arranged from most significant stage, $31_1$, to least significant stage, $31_M$. Each of the stages $31_1$–$31_M$ has at least one integrator $13_1$–$13_M$ and a quantizer $16_1$–$16_M$. Dither from the dither generator 33 is added to the stages $31_1$–$31_M$ via filters $34_1$–$34_M$. The transfer function of the filters $34_1$–$34_M$ is proportional to the noise shaping transfer function of the modulator between the dither addition point and the input to the quantizer. Preferably, the quantizer used for determining the transfer function of the modulator 9 is the quantizer of the least significant stage, $33_M$.

Figure 1:
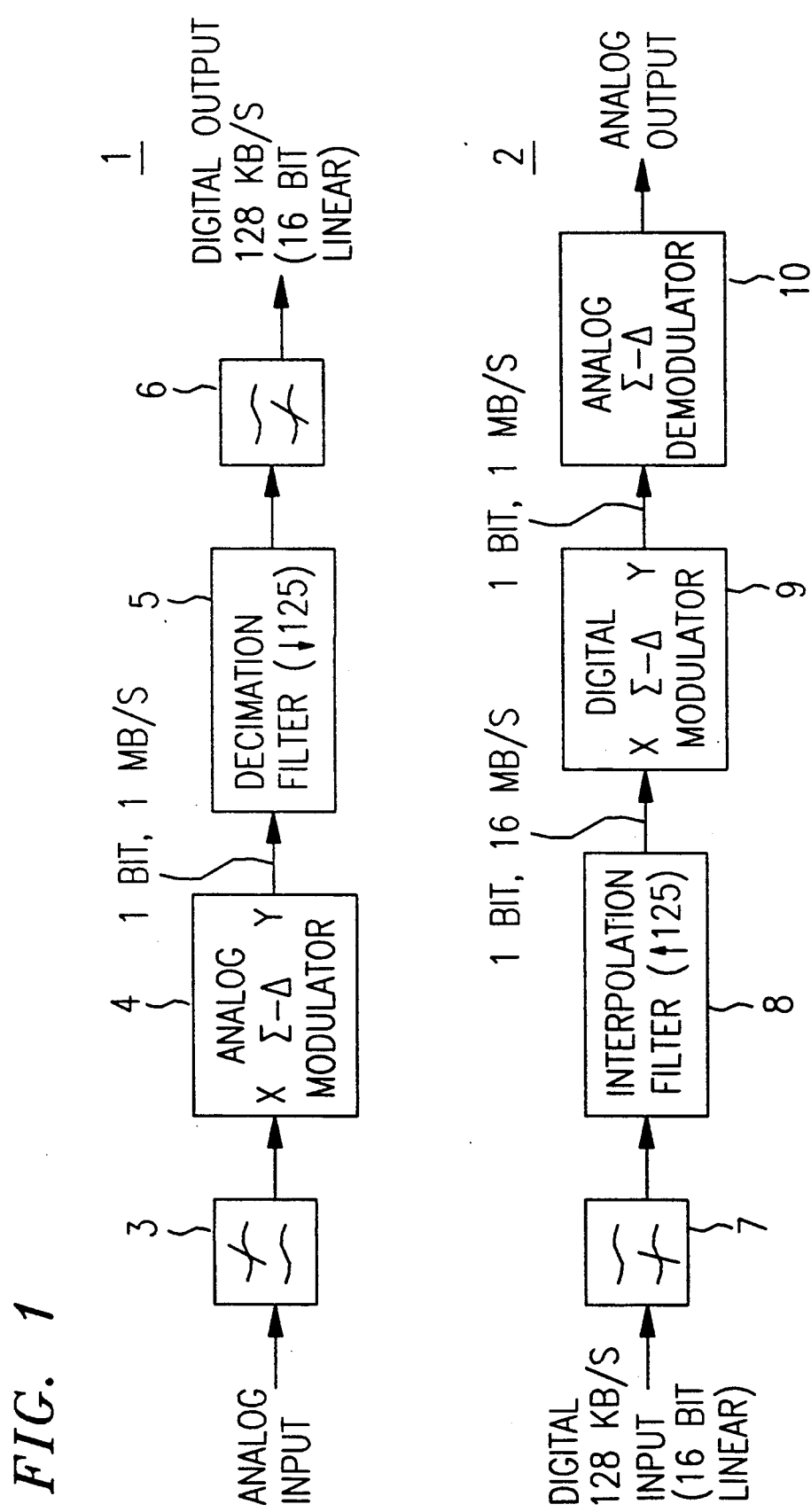
FIG. 1 is a simplified block diagram of an encoder/decoder (codec) using sigma-delta modulation techniques.

Referring to FIG. 1, an exemplary encoder 1 and decoder 2, usually referred to as a codec in combination, is shown for converting an analog signal to a sixteen bits per sample, linear, 128 kilobit per second (KB/s) digital data output stream and vice-versa. The encoder 1 converts the analog input signal to a digital data stream by first bandlimiting the analog signal to less than the Nyquist frequency by a well known anti-aliasing filter 3. The analog $\Sigma$-$\Delta$ modulator 4 then converts the bandlimited analog signal into a one-bit-per-sample, one megabit per second (MB/s), data stream, as will be discussed in more detail below. A decimation filter then converts the one-bit-per-sample digital stream into a sixteen bits per sample, 128 MB/s, data stream. The sixteen bits per sample stream is then filtered by high-pass filter 6 to remove substantially all DC energy.

Conversely, the decoder 2 receives the sixteen bits per sample digital data stream, again removing any DC component therein with high-pass filter 7, and converting the 128 KB/s digital input into a sixteen bits per sample, 16 MB/s data stream in interpolation filter 8. A digital $\Sigma$-$\Delta$ modulator 9 converts the 16 MB/s stream into a one-bit-per-sample, one MB/s stream for the analog $\Sigma$-$\Delta$ demodulator 10 to convert into an analog signal.

Operation of the decimation filter 5 and interpolation filter 8 are well known in the art and will not be discussed here. See *A Voiceband CODEC With Digital Filtering* by J. C. Candy et al., IEEE Trans. on Communications, Vol. COM-29, Number 6, June, 1981, pp. 815–830, which is incorporated herein by reference. Similarly, operation of the demodulator 10 is well known in the art and will not be discussed here. See *A Use Of Double Integration In Sigma Delta Modulation*, by J. C. Candy, IEEE Trans. on Communications, Vol. COM-33, No. 3, March 1985, pp 249–258, and incorporated herein by reference.

In the exemplary embodiment of the invention, the analog $\Sigma$-$\Delta$ modulator 4 and the digital $\Sigma$-$\Delta$ modulator 9 are substantially similar in operation (ignoring, for the sake of convenience, obvious differences between analog and digital circuitry). For simplicity, however, only the digital $\Sigma$-$\Delta$ modulator will be discussed in detail. It is understood that a duality exists between the digital domain and analog domain; the invention described herein also applies to the analog $\Sigma$-$\Delta$ modulator 4.

In FIG. 2, the preferred embodiment of an exemplary digital $\Sigma$-$\Delta$ modulator 9 is shown. The structure shown here is commonly referred to as a "Candy modulator", as described in the second Candy reference cited above. While the advantages, design, and operation details of the modulator 9 are described in the above-identified article, the basic structure and operation thereof will be described herein. The modulator 9 has at least one integrator $13_1$–$13_N$, subtracter $14_1$–$14_N$, and gain stage $15_1$-$15_N$. Each gain stage $15_1$-$15_N$ has a corresponding gain $A_1$-$A_N$. Output from the final integrator $13_N$ is coupled to a quantizer 16 via a summer 17. The output of the quantizer 16 is the output of the modulator 9 as well as the feedback to the integrators $13_1$-$13_N$. The quantizer 16 has predetermined step sizes or levels, determined by the thresholds in the quantizer 16. In the preferred embodiment, the number of levels is two (one threshold, preferably at zero for bipolar input signals), and the step size is between the maximum signal amplitude (positive or negative) and zero.

Added to the output from the final integrator $13_N$ is a noise signal from dither generator 18, which will be described in more detail below. For purposes here, generator 18 preferably creates a dither (noise) signal having an average amplitude of approximately zero while the normalized power in the AC component of the dither signal is between approximately $$\frac{2^{-2(N-1)}}{12}$$

times and one times the square of the step size of the quantizer 16, where N is the order (the number of integrators) of the modulator. By setting the normalized power in the AC component of the dither signal to approximately withing the range given above, the dither signal substantially suppresses the idle channel periodic noise and spurious tones, discussed above, without substantially increasing the idle noise (noise floor) level of the decoder 2 (FIG. 1). For example, if the order of the modulator 9 is two (there are two integrators, $13_1$, $13_2$, where N=2), then the normalized power in the AC component of the dither signal should be between 1/48 times and one times the square of the step size of the quantizer 16.

An exception to the above is with first order (single integrator) modulators 9. In this case, the preferable normalized power in the AC component of the dither signal is between 1/12 times and one times the square of the step size of the quantizer 16.

In addition to adding the dither signal to the output of the last integrator $13_N$, the dither may be added anywhere within the modulator 9 with suitable filtering. Filters $11_1$-$11_N$ filter the dither signal from the dither generator 18 prior to adding the dither to the inputs of the corresponding integrators $13_1$-$13_N$. The transfer function of the filters $11_1$-$11_{N+1}$ is proportional to the noise shaping transfer function of the modulator 9 between the point where the dither is injected and the input to the quantizer 16. For an $N^{th}$ order modulator 9 shown in FIG. 2, the noise shaping transfer function of the modulator 9 is generally proportional to $(1-z^{-1})^N$, referred to the input X of the modulator 9. Hence, injecting a dither signal to the input to the first integrator, $13_1$, has the dither signal filtered by filter $11_1$ having a transfer function proportional to an $N^{th}$ order differentiator. More pragmatically, the filters $11_1$-$11_{N+1}$ has a differentiator of the order equal to the number of integrators $13_1$-$13_N$ between the point of dither signal injection (where the corresponding filter $11_1$-$11_{N+1}$ couples to the modulator 9) and the input to the quantizer 16. Hence, filter $11_{N+1}$ has no differentiation (zero order differentiation) since the noise shaping transfer function of the modulator 9 at the input to the quantizer 16 is not significantly shaped by the integrators $13_1$-$13_N$. Similarly, injecting dither into the input of the integrator $13_N$ infers that the transfer function of the filter $11_N$ is a first derivative, $1-z^{-1}$, since the noise shaping transfer function is significantly shaped by the integrator $13_N$.

It is noted that while N integrators $13_1$-$13_N$ are shown, as a practical matter, one to five integrators may be all that can be used depending on the application of the codec (1,2 FIG. 1).

As noted above, the $\Sigma$-$\Delta$ modulator may be in analog form, such as modulator 4 in FIG. 1. In such a case, the modulator 9 shown in FIG. 2 may require a digital-to-analog converter (not shown) to convert the digital output of the quantizer 16 back into analog form for presentation to the integrators $13_1$-$13_N$. In addition, another digital-to-analog converter (not shown) may be needed to convert the dither signal (if in digital form) from the generator 28 into analog form. It is understood that as few as two or three bits of digital dither signal may be used in this approach.

Figure 3:
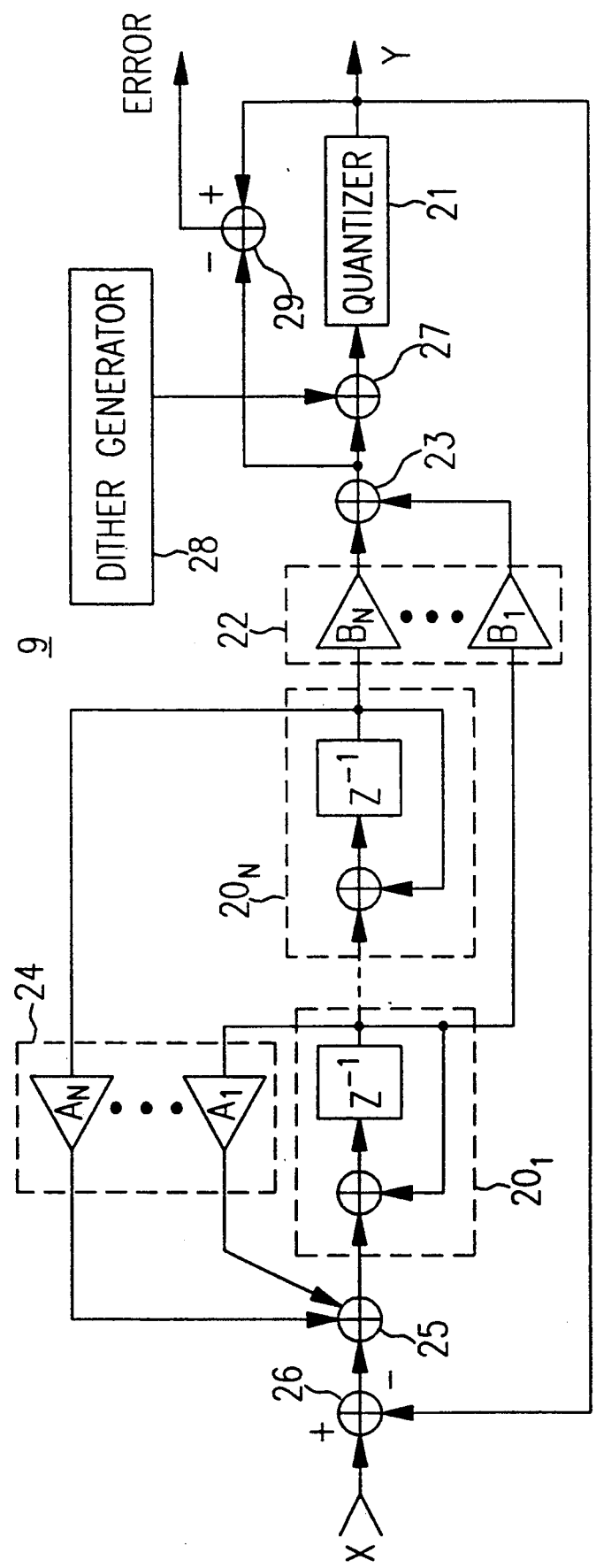
FIG. 3 is a simplified diagram of an alternative form of a sigma-delta modulator, according to another embodiment of the invention; and, FIG. 4 is a simplified diagram of another approach to sigma-delta modulation utilizing multiple stages of sigma-delta modulators, similar to those shown in FIGS. 2 and 3.

An alternative embodiment of the modulator 9 is shown in FIG. 3. The $\Sigma$-$\Delta$ structure shown here allows for the optimization of the zeros in the transfer characteristics of the modulator 9. As with the modulator 9 in FIG. 2, there are series coupled integrators $20_1$-$20_N$. Unlike the modulator 9 in FIG. 2, the modulator 9 of FIG. 3 has the outputs of one (or more) integrators $20_1$-$20_N$ coupled to the input of the quantizer 21 via corresponding weighted gain stages 22 and adder 23. In addition, outputs from the integrators $20_1$-$20_N$ are also coupled to the input of the first integrator $20_1$ via corresponding weighted gain stages 24 and adder 25 to form a feedback path. Feedback from the quantizer 21 only goes to the input of the modulator 9 through subtracter 26. Adder 27 adds to the output of adder 23 the dither signal from dither generator 28 for coupling to the input of the quantizer 21. Adders 23 and 27 may be combined into a common adder (not shown). The dither generator 28 is similar to the dither generator 18 in FIG. 2 and the noise signal therefrom has the same normalized AC power limitations as described above. Further, the dither may be added to the input via adders 25 or 26, or at any intermediate point within the modulator 9, with suitable filtering, as described above.

Another approach to forming a $\Sigma$-$\Delta$ modulator 9 is a multiple stage $\Sigma$-$\Delta$ modulator, commonly referred to as an MSM or MASH, shown in FIG. 4. In general, this technique relies on a subsequent $\Sigma$-$\Delta$ modulator stage $31_{i+1}$ ($1 \leq i \leq M-1$ to convert quantization errors of the previous $\Sigma$-$\Delta$ modulator stage $31_i$ to increase the number of bits of resolution of the modulator 9. Similar to the modulator 9 of FIG. 2, each $\Sigma$-$\Delta$ modulator stage $31_i$ (not shown, $1 \leq i \leq M-1$ has a subtracter $19_i$ (not shown) with the output of integrator $13_i$ (not shown) as one input and the output of the quantizer $16_i$ (not shown) as the other input. The output of substracter $19_i$ (not shown) is then the quantization error (ERROR) for the stage $13_i$ (not shown) plus the dither signal from generator 33. Similarly, subtracter 29 in FIG. 3 generates the quantization error for that modulator. Returning to FIG. 4, the quantization error (ERROR) of the first (highest order) $\Sigma$-$\Delta$ modulator $31_1$ is then converted by a subsequent modulator $31_2$ (not shown), up to the last (least significant) $\Sigma$-$\Delta$ modulator $31_M$. The digital output of the modulators $31_1$-$31_M$ are combined and equalized in a combining network 32. A dither generator 33 generates the dither signals for each of the modulators $31_1$-$31_M$ for the purpose discussed above. It is preferable that each of the dither signals to the $\Sigma$-$\Delta$ modulators $31_1$-$31_M$ be uncorrelated. It is understood that not all of the modulators need to have a dither signal coupled thereto; it may be sufficient to have the dither signal coupled to only the first one or two of the modulators $31_1-31_M$. Also as discussed above, the addition of dither should be filtered prior to adding it to the modulator 9. The transfer function of the filters $34_1-34_{M+1}$ is preferably proportional to the noise shaping transfer function of the modulator 9 between the point dither addition and the input of the quantizer $16_M$ in the least significant stage $31_M$. For example, if dither was to be added to the input of the first integrator, $13_1$, of the first stage, $31_1$, then the dither from generator 33 is filtered by a filter $34_M$ having a transfer function including an $M^{th}$ order derivative, $(1-z^{-1})^M$. As discussed in connection with FIG. 2, the filter $34_{M+1}$ has a transfer function of "1", i.e., no significant shaping (except for amplitude scaling, if any) of the dither signal occurs. As discussed above, a more pragmatic approach to determine the order of the differentiator in each transfer function of the filters $34_1-34_{M+1}$ is to count the number of integrators $13_1-13_M$ between the point of dither signal injection (where the corresponding filter $34_1-34_{M+1}$ couples into the modulator 9) and the input of the quantizer $16_M$ in the least significant stage $31_M$. The number of integrators is then the order of the differentiator within the corresponding filter $34_1-34_{M+1}$.

The dither generators 18 (FIG. 2), 28 (FIG. 2), and 33 (FIG. 4) are preferably formed using one or more maximal length, linear feedback, shift registers (not shown), commonly called a MLSR, to generate a pseudorandom binary sequence as the dither signal. In the preferred embodiment, there are 25 taps on the shift register, with feedback from taps 1 and 23. Sixteen taps (bits) on the shift register are used as the dither signal (sign extended) added to the outputs of the stages $12_N$ (FIG. 2) or integrators $20_1-20_N$ (FIG. 3). Other methods for generating the dither signal and other shift register lengths may be used. It is preferable, however, to have the period of the pseudorandom sequence much longer than the period of the lowest frequency signal to be processed by the modulator. In the preferred embodiment, the data paths in the modulator 9 (FIGS. 2,3) are at least 21 bits wide.

It is understood that a single MLSR generates a noise (dither) signal with a nearly uniform PDF. It may be preferable, however, to use multiple MLSRs with uncorrelated noise signals and combine (e.g., add) the noise signals together to achieve a non-uniform PDF, such as a triangular (first order), or higher order, PDF. Further, the PDF of the noise signal may be weighted or skewed to achieve a desired level of spurious tone suppression. While the average (DC) value of the noise (dither) signal is preferably near zero, having a DC value may be advantageous in certain circumstances where, for example, the modulator 9 reacts to DC signals with a certain output (digital) pattern which may be easier to suppress with dither.

In the foregoing embodiments, the invention is discussed as a discrete time implementation using digital or switched-capacitor circuitry, for example. However, the invention may be utilized in a continuous time form. As is well known to those with ordinary skill in the art, the disclosed modulator circuitry may be converted to a continuous time form using resistor-capacitor or transconductance amplifier-capacitor circuitry, for example.

Having described the preferred and other exemplary embodiments of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A sigma-delta modulator having:
   at least one integrator having an input and an output; and,
   a quantizer having a predetermined step size, the input thereof coupling to the output of the integrator; and,
   characterized by:
   means for adding a dither signal to the modulator, the dither signal having a predetermined normalized power in the AC component thereof;
   wherein the minimum normalized AC power of the dither signal is about:

$$\frac{2^{-2(N-1)}}{12} \text{ for } N \geq 2;$$

or $$1/12 \text{ for } N = 1;$$

of the square of the predetermined step size of the quantizer; and,
   wherein N is the number of integrators in the modulator.

2. The sigma-delta modulator as recited in claim 1, wherein the means for adding (17, 27) is disposed between the output of the integrator and the input of the quantizer.

3. The sigma-delta modulator as recited in claim 2, wherein the average value of the dither signal is approximately zero.

4. The sigma-delta modulator as recited in claim 3, wherein the maximum normalized AC power of the dither signal is equal to or less than one time the square of the predetermined step size of the quantizer.

5. The sigma-delta modulator as recited in claim 4, wherein the dither signal is generated by at least one pseudo-random sequencer.

6. A multi-stage sigma-delta modulator having a plurality of stages, at least one stage having:
   at least one integrator having an input and an output; and,
   a quantizer having a predetermined step size, the input thereof coupling to the output of the integrator;
   characterized by:
   means for adding a dither signal to at least one stage in the modulator, the dither signal having a predetermined normalized power in the AC component thereof;
   wherein the minimum normalized AC power of the dither signal is about:

$$\frac{2^{-2(N-1)}}{12} \text{ for } N \geq 2;$$

or $$1/12 \text{ for } N = 1;$$

of the square of the predetermined step size of the quantizer; and,
   wherein N is the number of integrators in the stage.

7. The multi-stage integrator modulator as recited in claim 6, wherein the means for adding (17, 27) is disposed between the output of the integrator and the input of the quantizer.

8. The sigma-delta modulator as recited in claim 7, wherein the average value of the dither signal is approximately zero.

9. The sigma-delta modulator as recited in claim 8, wherein the maximum normalized AC power of the dither signal is equal to or less than one times the square of the predetermined step size of the quantizer.

10. The sigma-delta modulator as recited in claim 9, wherein the dither signal is generated by a pseudo-random sequencer.

11. A sigma-delta modulator having:
- at least one integrator having an input and an output; and,
- a quantizer having a predetermined step size, the input thereof coupling to the output of the integrator;

characterized by:
- means for adding a dither signal to a point in the modulator; and,
- filter means for filtering the dither signal prior to being added to the modulator;
- wherein the transfer function of the filter means is proportional to the noise shaping transfer function of the modulator between the point of addition of the dither and the input to the quantizer.

12. The sigma-delta modulator as recited in claim 11, wherein the transfer function of the filter means includes differentiation.

13. The sigma-delta modulator as recited in claim 12, wherein the dither signal is generated by at least one pseudo-random sequencer.

14. A multi-stage sigma-delta modulator having a plurality of stages, one stage being the least significant stage, at least one stage having:
- at least one integrator having an input and an output; and,
- a quantizer having a predetermined step size, the input thereof coupling to the output of the integrator;

characterized by:
- means for adding a dither signal to a point in the modulator; and,
- filter means for filtering the dither signal prior to being added to the modulator;
- wherein the transfer function of the filter means is proportional to the noise shaping transfer function of the modulator between the point of adding dither and the input of the quantizer in the least significant stage.

15. The multi-stage sigma-delta modulator as recited in claim 14, wherein the transfer function of the filter means includes differentiation.

16. The sigma-delta modulator as recited in claim 15, wherein the stages are arranged from most significant to least significant and the noise shaping transfer function of the modulator is defined as being from the point of adding dither to the input of the quantizer in the least significant stage.

17. The sigma-delta modulator as recited in claim 16, wherein each of the stages has dither applied thereto.

* * * * *